United States Patent [19]

Wang

[11] Patent Number: 5,373,467

[45] Date of Patent: Dec. 13, 1994

[54] SOLID STATE MEMORY DEVICE CAPABLE OF PROVIDING DATA SIGNALS ON 2N DATA LINES OR N DATA LINES

[75] Inventor: Ping Wang, Saratoga, Calif.

[73] Assignee: Silicon Storage Technology, Inc., Sunnyvale, Calif.

[21] Appl. No.: 150,612

[22] Filed: Nov. 10, 1993

[51] Int. Cl.$^5$ .......................... G11B 7/00; G06F 13/40
[52] U.S. Cl. .......................... 365/189.02; 365/230.30; 365/230.02; 395/325
[58] Field of Search .............. 365/189.02, 189.01, 365/230.02, 230.03, 230.04; 395/275, 325

[56] References Cited

U.S. PATENT DOCUMENTS

| | | | |
|---|---|---|---|
| 4,309,754 | 1/1982 | Dinwiddie, Jr. | 395/325 |
| 4,447,878 | 5/1984 | Kinnie et al. | 395/325 |
| 4,683,534 | 7/1987 | Tietjen et al. | 395/325 |
| 4,716,527 | 12/1987 | Graciotti | 395/323 |
| 5,029,130 | 7/1991 | Yeh | 365/185 |
| 5,055,661 | 10/1991 | Gochi | 365/189.02 |
| 5,113,369 | 5/1992 | Kinoshita | 395/325 |
| 5,113,497 | 5/1992 | Dewa | 395/275 |
| 5,323,356 | 6/1994 | Okunaca | 365/230.03 |

Primary Examiner—Eugene R. LaRoche
Assistant Examiner—Tan Nguyen
Attorney, Agent, or Firm—Limbach & Limbach

[57] ABSTRACT

A solid state peripheral storage device in compliance with the PCMCIA standard provides data signals on either 16 data signal lines or 8 data signal lines. The device has a plurality of even number of substantially identical memory integrated circuit chips divided into two groups. Each of the memory integrated circuit chips provides 8 data signal lines divided into two groups of 4 data signal lines. One of the group of 4 data signal lines from one of the group of memory chips is grouped with one of the 4 data signal lines from the other group of memory chips to form a first group of 8 contiguous bus of data signal lines. The other group of 4 data signal lines from one group of memory chips is also collected with 4 data signal lines from the other group of memory chips to form a second group of 8 contiguous data signal lines. The two groups of 8 contiguous data signal lines are grouped together to form the bus of 16 data signal lines.

4 Claims, 2 Drawing Sheets

SOLID STATE MEMORY DEVICE CAPABLE OF PROVIDING DATA SIGNALS ON 2N DATA LINES OR N DATA LINES

TECHNICAL FIELD

The present invention relates to a solid state memory device and more particularly to a solid state peripheral storage device, to be used with a computer, for providing data signals to the computer in one of two modes. In a first mode, the solid state peripheral storage device provides data signals simultaneously on 2N data lines. In a second mode, the solid state peripheral storage device provides data signals on N data lines.

BACKGROUND OF THE INVENTION

Solid state memory storage devices employing electrically alterable programmable read-only memory cells, such as that disclosed in U.S. Pat. No. 5,029,130 are well known in the art. Such peripheral storage devices are used with computers, such as notebooks and laptops. A standard, PCMCIA (Personal Computer Memory Card International Association), has been adopted to set the electrical and mechanical interface between the solid state peripheral storage device and the computer. The PCMCIA standard, however, is a plurality of standards. As each new standard of PCMCIA is set, due to technological changes, such as increase in data bus bandwidth, the PCMCIA organization has set the standards such that the new interface requirement would also be compatible with the previously set standards. In the industry this is termed "backward compatibility".

One of the requirements of the more recently adopted PCMCIA standard, is that the peripheral storage device must be able to supply data signals to the computer on a data bus having a width of 16 data signal lines. In addition, however, to be backward compatible, this standard has also required that the peripheral storage device be able to provide data signals on 8 of the 16 data signal lines in accordance with a prior adopted PCMCIA standard.

To efficiently accommodate both of these requirements, is the object of the present invention.

SUMMARY OF THE INVENTION

In the present invention, a solid state memory device is responsive to a control signal for providing 2N data signals simultaneously on 2N data signal lines. The device is also capable of providing N data signals simultaneously on N of the 2N data signal lines. The device comprises a plurality of even number of substantially identical semiconductor memory integrated circuit chips divided into two groups. Each memory integrated circuit chip has an addressable memory circuit for providing N data signals simultaneously on N internal data signal lines in response to an address signal. A multiplexer receives the N internal data signal lines and the control signal and in response thereto provides either N data signals simultaneously on N external data signal lines or N/2 data signals simultaneously on one of the two N/2 external data signal lines. In addition, one of the two N/2 external data signal lines of one group of semiconductor memory integrated circuit chips and one of the two N/2 external data signal lines of another group of semiconductor memory integrated circuit chips are collected together and form the group of N data signal lines from the storage device. In this manner, 2N data signals can be provided simultaneously on the 2N data signal lines or N data signals can be provided simultaneously on one of the groups of N data signal lines.

BRIEF DESCRIPTION OF THE DRAWINGS

FIG. 4 is are two memory maps showing the addressing of the bytes retrieved from the memory device of the present invention, operating in two modes, where

DETAILED DESCRIPTION OF THE DRAWINGS

Figure 1:
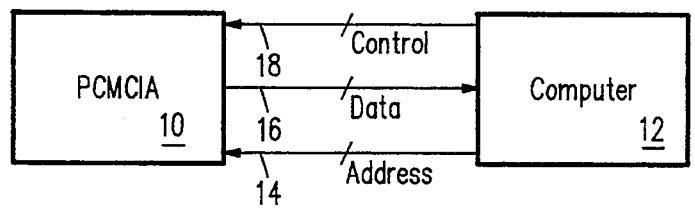
FIG. 1 is a schematic block level diagram of a solid state memory device of the present invention used as a peripheral storage device for interface with a computer.

Referring to FIG. 1 there is shown a solid state memory device 10 of the present invention connected to a computer 12. The solid state memory device 10 functions as a solid state peripheral storage device and in the preferred embodiment, it interfaces with a computer 12 in accordance with the PCMCIA standard. In accordance with the PCMCIA standard, the device 10 receives address signals from the computer 12 on an address bus 14 and control signals on a control bus 18, and in response thereto provides data signals on a data bus 16 to the computer 12. As previously discussed, the PCMCIA standard to which the device 10 adheres is backward compatible with the previously adopted PCMCIA standards. Thus, in the preferred embodiment, the device 10 provides two modes of operation. In one mode of operation, 16 data signals are provided, simultaneously on 16 data lines which form the data bus 16. In another mode of operation, the device 10 provides 8 data signals, simultaneously on 8 of the 16 data lines of the data bus 16.

Figure 2:
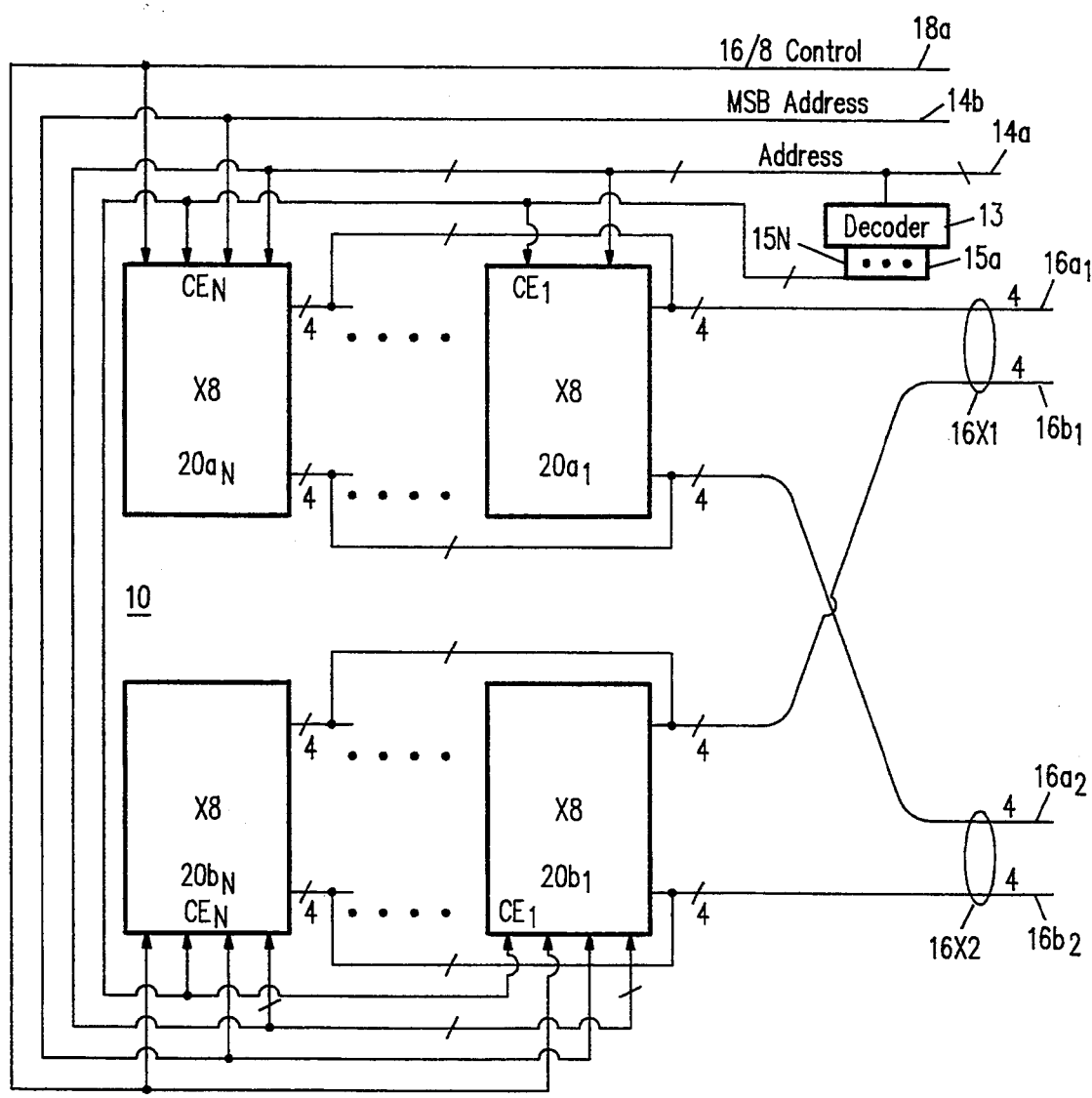
FIG. 2 is a detailed block level diagram of the solid state memory device shown in FIG. 1, showing a plurality of even number of substantially identical semiconductor memory integrated circuit chips and the grouping of the data signal lines which form the output of each of the chips.

Referring to FIG. 2 there is shown a detailed block level diagram of the device 10, shown in FIG. 1. The address bus 14 is separated into a Most Significant Byte (MSB) address line 14b and a plurality of address signal lines collectively identified as address bus 14a, which form the lower address signals for the address bus 14. One of the control signal lines of the control bus 18 is a 16/8 control line 18a. The 16/8 control line 18a determines whether the device 10 is to supply 16 data signals simultaneously on 16 data signal lines of the data bus 16, in compliance with one of the PCMCIA standard, or 8 data signals simultaneously on 8 of the 16 data signal lines of the bus 16 in a second PCMCIA standard.

The device 10 comprises a plurality of even number of substantially identical semiconductor memory integrated circuit chips 20. The plurality of even number of substantially identical semiconductor memory integrated circuit chips 20 are divided into two groups: a first group 20a1 ... 20an and a second group 20b1 ... 20bn. The first group 20a1 ... 20an has the same number of chips as the second group 20b1 ... 20bn. Each of the semiconductor memory chips 20 receives the address bus 14a, the MSB address line 14b, and the control signal line 18a.

Each of the memory chips 20 provides eight (8) data signals on eight (8) data signal lines. The eight (8) data signal lines of each chip of the first group 20a1 ... 20an are divided into two subgroups of four (4) data signal lines, 16a1 and 16a2, with the same subgroup of the four data signal lines of each chip 20a1 ... 20an connected together. Similarly, the eight (8) data signal lines of each chip of the second group 20b1 ... 20bn are divided into two subgroups of four (4) data signal lines 16b1 and 16b2, with the same subgroup of the four data signal lines of each chip 20b1 ... 20bn connected together.

Finally, one of the subgroup of four (4) data signal lines of the first group of chips 20a1 ... 20an, e.g. 16a1, is collected with one of the subgroup of four (4) data signal lines of the second group of chips 20b1 ... 20bn, e.g. 16b1 to form a first bus (16X1) of 8 contiguous data signal lines. Subgroup data signal lines 16a2 are collected with subgroup data signal lines 16b2 to form a second bus (16X2) of 8 contiguous data signal lines. The first and second buses (16X1 and 16X2) form the bus 16.

The address bus 14a is also supplied to a decoder 13. The decoder 13 generates a plurality of N Chip Enable (CE) control lines 15a ... 15n. Each CE control line 15, e.g. 15a, is supplied to a pair of semiconductor chips 20. Thus, the CE control line 15a is supplied to chips 20a1 and 20b1, and controls the operation thereof. The CE control line 15b is supplied to chips 20a2 and 20b2, and controls the operation thereof. If a particular CE control line is on that pair of chips 20 are activated; all the rest of the chips 20 are not active.

Figure 3:
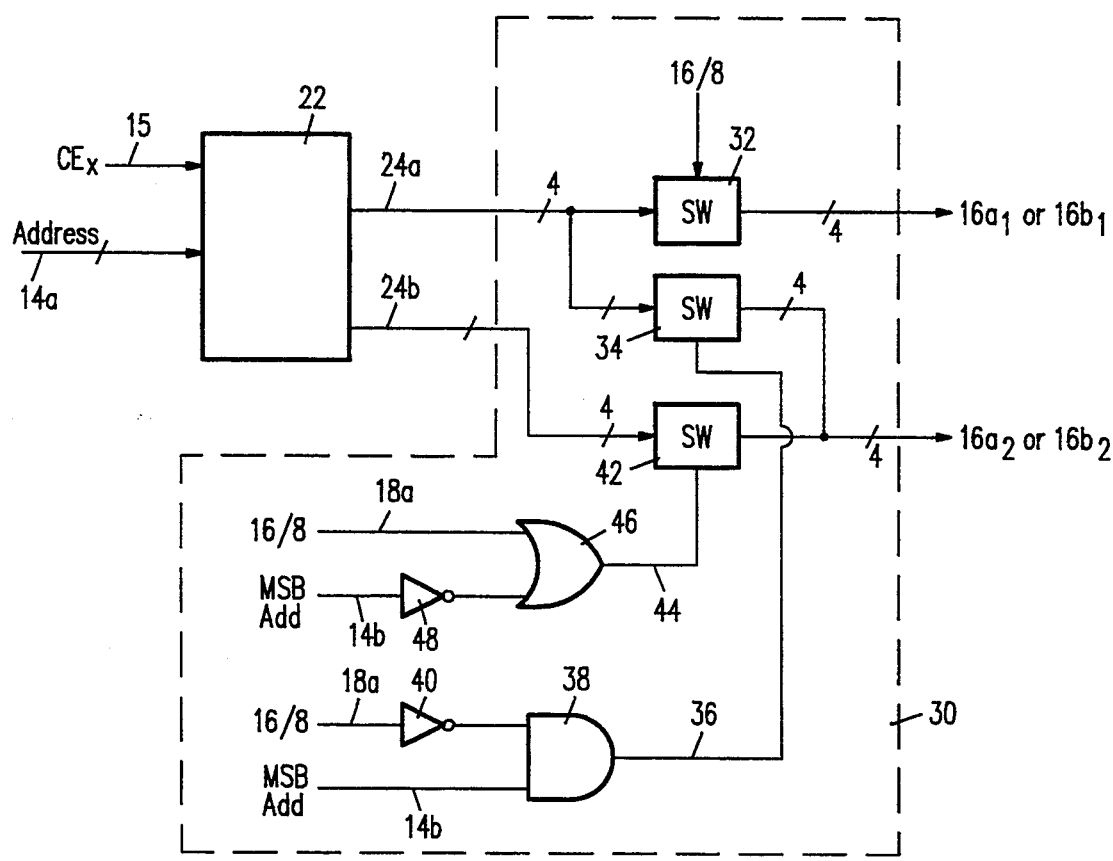
FIG. 3 is a detailed circuit diagram of each of the semiconductor memory integrated circuit chips shown in FIG. 2, showing the memory circuit portion and the multiplexer portion.

Referring to FIG. 3 there is shown in greater detail a schematic circuit diagram of each of the semiconductor memory integrated circuit chip 20. Each chip 20 comprises an array 22 of semiconductor memory cells. In the preferred embodiment, each of the memory cells in the array 22 is an electrically alterable programmable read-only memory type, such as that disclosed in U.S. Pat. No. 5,029,130, assigned to the present assignee, and incorporated herein by reference. The array 22 receives the address bus 14a, and the particular CE control line 15, and in response thereto supplies 8 data signals simultaneously on 8 internal data signal lines 24, divided into two groups of 4 internal data signal lines each, designated as 24a and 24b.

Each chip 20 also comprises a multiplexer 30. The multiplexer 30 receives the 8 internal data signal lines 24, divided into 2 groups of 4 internal data signal lines each, 24a and 24b, from the memory array 22. The multiplexer 30 comprises a first switch 32 which receives the 4 internal data signal lines 24a and the 16/8 control signal 18a, and in response thereto provides four data signals on the four data signal lines 16a1 or 16b1, depending upon which group the chip 20 is a member of.

The multiplexer 30 also comprises a second switch 34, which also receives the 4 internal data signal lines 24a and a first control signal 36, and in response thereto connects the data signal lines 24a to the four data signal lines 16a2 or 16b2, depending upon which group the chip 20 is a member of. The first control signal 36 is generated by an AND gate 38 which receives as its input thereof the 16/8 control signal 18a, inverted by an inverter 40, and the MSB address signal 14b. Thus, in the event the 16/8 control signal 18a goes low and the MSB address signal 14b goes high, the output of the AND gate 38 would generate the control signal 36 being high which would cause the second switch 34 to be on thereby passing the data signals on the internal data signal lines 24a to the data signal lines 16a2 or 16b2.

The multiplexer 30 also comprises a third switch 42. The third switch 42 receives the second group of 4 internal data signal lines 24b, and a second control signal 44 and in response thereto connects the data signal lines 24b to the data signal lines 16a2 or 16b2 as the case may be. The second control signal 44 is generated by a first OR gate 46 which receives as its input the 16/8 control signal 18a and the MSB address signal 14b inverted by an inverter 48. Thus, the internal data signal lines 24b would be connected to the data signal lines 16a2 or 16b2, as the case may be, in the event either the 16/8 control signal 18a is high or the MSB address signal 14b is low.

Figure 4A:
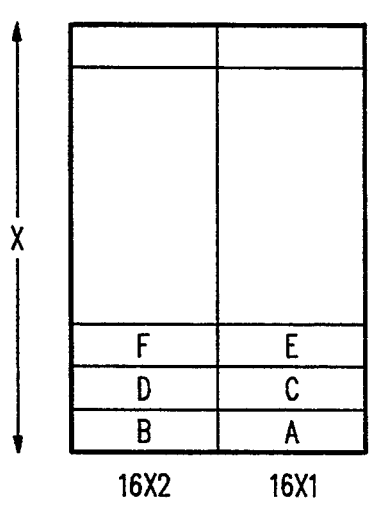
FIG. 4(a) shows the retrieval of 16 bits or two bytes of data signals, simultaneously.

In the operation of the device 10 of the present invention, in the event the computer 12 operating its software program desires to receive data from the device 10 in the mode where data signals are supplied simultaneously on the entire 16 lines of the data bus 16, then the 16/8 control signal 18a would be high. In that event, the first switch 32 of the multiplexer 30 of each of the chips 20 would be activated connecting the 4 internal signal lines 24a from the memory array 22 with the signal lines 16a1 and 16b1. In addition, with the 16/8 control signal 18a being high, the third switch 42 of the multiplexer 30 of each of the chips 20 would connect the 4 internal signal lines 24b with the signal lines 16a2 and 16b2. Second switch 34 would not be activated because the first control signal 36 would not be generated. In this manner, data from the memory array 22 of all the chips 20 would be supplied to the 16 data signal lines 16a1, 16a2, 16b1, and 16b2. This is shown in FIG. 4(a).

In the event the computer 12 operating its software, desires to retrieve data from the device 10 in accordance with a backward compatible PCMCIA standard, or only 8 data signals at a time, then the 16/8 control signal 18a goes low or is deactivated. In that event, the first switch 32 would be inactive. In addition, the second and third switches 34 and 42, respectively, would be controlled by the state of the MSB address line 14b. Since the entire device 10 can provide either a single block of 16-bit wide data or two contiguous blocks of 8-bit wide data, in the latter mode, the device 10 can be viewed as comprising an addressable lower byte of 8-bit wide data signals and an addressable upper byte of another 8-bit wide data signals. In that event, the MSB address line 14b is used to activate either the upper byte or the lower byte of eight (8) data signals.

In the event the MSB address line 14b is low, then the lower byte of eight (8) data signal lines is retrieved from the device 10 and is supplied on the bus 16X2. In the event the MSB address line 14b goes low, the second switch 34 of each of the chips 20 would not be activated. With the MSB address line 14b being low, the signal passing through the inverter 48 would become high. This would then activate the third switch 42 of each of the multiplexer 30 of each of the chips 20. This would then cause the 4 internal data signal lines 24b to be connected to the data signal lines 16a2 for the first block of chips 20a1 ... 20an and to be connected to the data signal lines 16b2 for the second block of chips 20b1 ... 20bn. In that event, since the data signal lines 16a2 and 16b2 are grouped together to form 8 data signal lines 16X2, it can be seen that these 8 data signal lines are supplied to the computer 12 on 8 contiguous data signal lines, along the bus 16X2.

Figure 4B:
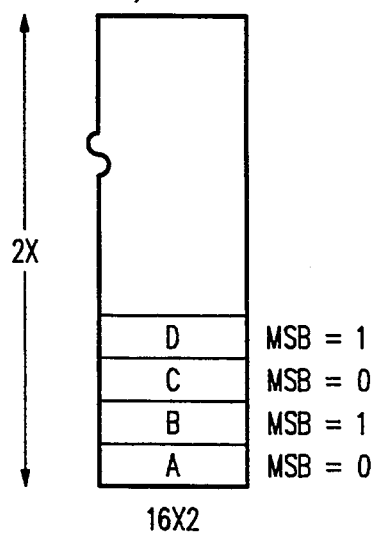
FIG. 4(b) shows the retrieval of 8 bits or one byte of data signals, simultaneously.

In the event the computer 12, operating its software desires to retrieve data from the device 10 from the second byte or the upper byte of 8-bit wide data signals, at the same address on the address bus 14(b), the MSB address line 14b would then go high. In that event, this would cause the third switch 42 of each of the multiplexer 30 of each of the chips 20 to be deactivated. This would cause the second switch 34 of each of the chips 20 to be activated causing the internal bus 24a to be connected to the data signal lines 16a2 and 16b2. Thus, the selection of the upper addressable byte of 8 bit data signals, through activation of the MSB address line 14b, would cause the eight data signals to be simultaneously supplied on the bus 16X2, to the computer 12, the same bus upon which the lower addressable block of 8 bit data signals is supplied. Thus, when the device 10 is operating in the retrieval of by eight data signals mode, all of the data signals are supplied to the computer 12 on the eight bit data bus 16X2. This would be in compliance with the backward compatible PCMCIA standard. This is shown in FIG. 4(b).

There are many advantages of the device of the present invention. First, by incorporating the multiplexer 30 into each integrated circuit chip 20, the size of each chip 20 is not substantially increased. Thus, the packaging of the plurality of integrated circuit chips onto a single printed circuit board would not require an external multiplexer which can take up room on the printed circuit board. Furthermore, as compared to simply using a semiconductor integrated circuit memory chip which provides 16 data signal lines as its output in a package with a multiplexer therein, with the apparatus of the present invention using chips which provide 8 data signal lines as output, results in more efficient utilization of printed circuit board space. In particular, integrated circuit chips which provides 16 signal lines as its output require bigger package and thus less of the chips can be placed on a single printed circuit board. Furthermore, it should be apparent to those skilled in the art, that this invention is not limited to providing 16 and 8 bits of data signals. The invention is equally applicable to providing 32/16 or 32/16/8 data signals.

What is claimed is:

1. In a solid state memory device responsive to a control signal for providing 2N data signals simultaneously on 2N external data signal lines, or providing N data signals simultaneously on N contiguous of the 2N external data signal lines, wherein said device comprising:
   a plurality of even number of substantially identical semiconductor memory integrated circuit means divided into two groups;
   each memory integrated circuit means having an addressable memory circuit for providing N data signals simultaneously on N internal data signal lines in response to an address signal; and multiplexer means for receiving said N internal data signal lines, and the control signal, and in response thereto for providing N data signals simultaneously on N external data signal lines, or N/2 data signals simultaneously on one of two groups of N/2 contiguous external data signal lines; and
   means for grouping one of the two groups of N/2 contiguous external data signal lines of one group of memory integrated circuit means with one of the two groups of N/2 contiguous external data signal lines of the second group of memory integrated circuit means to form a first N contiguous external data signal lines of the device, and grouping another of the two groups of N/2 contiguous external data signal lines of one group of memory integrated circuit means with another of the two groups of N/2 contiguous external data signal lines of the second group of memory integrated circuit means to form a second N external contiguous data signal lines of the device.

2. The device of claim 1 wherein said multiplexer means of each memory integrated circuit means also receives an address control signal and in response thereto for providing N/2 data signals on one of the two N/2 external data signal lines.

3. A solid state peripheral storage device for receiving a plurality of address signals supplied on an address bus, an address control signal and a control signal, said device for providing 2N data signals simultaneously on 2N data signal lines, or N data signals simultaneously on one group of N contiguous data signal lines; said device comprising:
   a plurality of even number of substantially identical semiconductor memory integrated circuit chips, divided into two groups;
   each chip comprising:
      an addressable memory circuit for providing N data signals simultaneously on two N/2 internal data signal lines in response to the address signals supplied on the address bus;
      multiplexer means for receiving the N data signals on the two N/2 internal data signal lines, the control signal and the address control signal and for providing:
         N data signals simultaneously on two N/2 external data signal lines in response to the control signal being in one state; or
         a first collection of N/2 data signals from one of the two N/2 internal data signal lines to one of the two N/2 external data signal lines in response to the control signal being in another state and the address control signal being in one state;
         a second collection of N/2 data signals from another of the two N/2 internal data signal lines to said one of the two N/2 external data signal lines in response to the control signal being in another state and the address control signal being in another state;
   means for grouping said one of the two N/2 external data signal lines of one group of memory chips with said one of the two N/2 external data signal lines of another group of memory chips to form the one group of N contiguous data signal lines.

4. The device of claim 3 wherein each memory circuit of each chip comprises an array of electrically alterable programmable cell.

* * * * *